(12) United States Patent
Nakamura

(10) Patent No.: US 8,022,451 B2
(45) Date of Patent: Sep. 20, 2011

(54) RADIATION DETECTOR

(75) Inventor: Shigeru Nakamura, Ashigarakami-gun (JP)

(73) Assignee: Fujifilm Corporation, Tokyo (JP)

( * ) Notice: Subject to any disclaimer, the term of this patent is extended or adjusted under 35 U.S.C. 154(b) by 268 days.

(21) Appl. No.: 12/240,358

(22) Filed: Sep. 29, 2008

(65) Prior Publication Data

US 2009/0250619 A1 Oct. 8, 2009

(30) Foreign Application Priority Data

Sep. 28, 2007 (JP) ................................. 2007-254584

(51) Int. Cl.
*H01L 31/062* (2006.01)
(52) U.S. Cl. ................ 257/293; 257/428; 257/E33.076; 250/370.09; 250/370.01
(58) Field of Classification Search ................. 257/293, 257/428, E33.076, E31.115; 250/214.1, 250/370.09, 370.01
See application file for complete search history.

(56) References Cited

U.S. PATENT DOCUMENTS 6,268,614 B1 7/2001 Imai
6,635,860 B2 * 10/2003 Sato et al. .................. 250/214.1
6,885,005 B2 4/2005 Sato et al.

* cited by examiner

*Primary Examiner* — Tan N Tran
(74) *Attorney, Agent, or Firm* — Sughrue Mion, PLLC

(57) ABSTRACT

A radiation detector comprises a voltage applying electrode, a photo-conductor layer, and a charge collecting electrode, which are overlaid one upon another. A selective charge transporting layer is located between the voltage applying electrode and the photo-conductor layer, the selective charge transporting layer having characteristics such that the selective charge transporting layer blocks electric charges having a polarity identical with the polarity of the voltage applying electrode and transports electric charges having a polarity opposite to the polarity of the voltage applying electrode. The selective charge transporting layer takes on the form of a thick film at a position corresponding to an edge region of the voltage applying electrode.

14 Claims, 2 Drawing Sheets

RADIATION DETECTOR

BACKGROUND OF THE INVENTION

1. Field of the Invention

This invention relates to a radiation detector adapted for use in a radiation imaging apparatus, such as an X-ray imaging apparatus.

2. Description of the Related Art

With respect to radiation imaging operations for medical diagnoses, there have heretofore been known radiation imaging apparatuses, in which radiation image detectors (utilizing semiconductors as principal sections) are utilized for detecting radiation and converting the radiation into an electric signal. Ordinarily, the radiation image detectors may be classified into a direct conversion type, wherein the radiation is directly converted into electric charges, and wherein the thus formed electric charges are accumulated; and an indirect conversion type, wherein the radiation is converted into light by use of a scintillator, such as CsI:Tl or GOS ($Gd_2O_2S$:Tb), wherein the thus obtained light is then converted into electric charges by use of a photo-conductor layer, and wherein the thus formed electric charges are accumulated. Also, in accordance with read-out techniques, the radiation image detectors may be classified into an optical read-out technique, wherein the electric charges having been generated with the irradiation of the radiation are accumulated at a charge accumulating section, and wherein the accumulated electric charges are read out by the utilization of a semiconductor material capable of generating the electric charges when being exposed to light; and an electric read-out technique, wherein the electric charges having been generated with the irradiation of the radiation are accumulated at accumulating capacitors, and wherein the accumulated electric charges are read out through an operation, in which an electric switch, such as a thin film transistor (TFT), a charge coupled device (CCD), or a complementary metal oxide semiconductor (CMOS) sensor, is turned on and off with respect to each of pixels.

The direct conversion types of the radiation image detectors are constituted for performing a radiation detecting operation, wherein a predetermined bias voltage is applied across a voltage applying electrode, which has been formed on a surface of a radiation-sensitive photo-conductor film, and a charge collecting electrode, which has been formed on a substrate, wherein the electric charges having been generated with the irradiation of the radiation are collected by the charge collecting electrode, which been formed on the opposite surface of the photo-conductor film, and wherein the thus collected electric charges are taken out as a radiation detection signal. By the application of a high voltage to the voltage applying electrode located on the photo-conductor film, the electric charges having been generated by the radiation are collected efficiently and are taken as a charge latent image. In the cases of the direct conversion types of the radiation image detectors, wherein the high voltage is applied to the voltage applying electrode, an edge region of the voltage applying electrode is set at a particularly high electric field, and therefore the problems are encountered in that breakdown from the edge region of the voltage applying electrode is apt to occur.

In view of the problems described above, there has heretofore been employed a technique, wherein a thick electrical insulator is located under the edge region of the voltage applying electrode, and wherein the breakdown at the edge region of the voltage applying electrode is thereby suppressed. (Reference may be made to, for example, U.S. Pat. No. 6,885,005.)

However, in cases where the electrical insulator is located as described above, new problems occur in that the electric charges which should be recombined at the voltage applying electrode remain without being recombined. Particularly, it has been found that, in cases where the radiation detector is used repeatedly, the problems occur in that the breakdown becomes apt to occur even further due to the electric charges remaining without being recombined owing to the electrical insulator, which has originally been provided for suppressing the breakdown.

SUMMARY OF THE INVENTION

The primary object of the present invention is to provide a radiation detector, wherein an electrical insulator need not be provided, and wherein breakdown at an edge region of a voltage applying electrode is capable of being suppressed even in cases where the radiation detector is used repeatedly.

The present invention provides a first radiation detector, comprising:

i) a voltage applying electrode, to which a voltage is to be applied, ii) a photo-conductor layer, which generates electric charges when radiation is irradiated to the photo-conductor layer, and iii) a charge collecting electrode, which collects the electric charges corresponding to a quantity of the radiation, the voltage applying electrode, the photo-conductor layer, and the charge collecting electrode being overlaid one upon another, wherein a selective charge transporting layer is located between the voltage applying electrode and the photo-conductor layer, the selective charge transporting layer having characteristics such that the selective charge transporting layer blocks electric charges having a polarity identical with the polarity of the voltage applying electrode and transports electric charges having a polarity opposite to the polarity of the voltage applying electrode, and the selective charge transporting layer takes on the form of a thick film at a position corresponding to an edge region of the voltage applying electrode.

The present invention also provides a second radiation detector, comprising:

i) a voltage applying electrode, to which a voltage is to be applied, ii) a photo-conductor layer, which generates electric charges when radiation is irradiated to the photo-conductor layer, and iii) a charge collecting electrode, which collects the electric charges corresponding to a quantity of the radiation, the voltage applying electrode, the photo-conductor layer, and the charge collecting electrode being overlaid one upon another, wherein a selective charge transporting layer is located only at a position between an edge region of the voltage applying electrode and the photo-conductor layer, the selective charge transporting layer having characteristics such that the selective charge transporting layer blocks electric charges having a polarity identical with the polarity of the voltage applying electrode and transports electric charges having a polarity opposite to the polarity of the voltage applying electrode.

Each of the first and second radiation detectors in accordance with the present invention should preferably be modified such that the selective charge transporting layer is constituted of a laminate structure comprising an inorganic selective transportable material layer and an organic selective transportable material layer.

Also, each of the first and second radiation detectors in accordance with the present invention should preferably be modified such that the voltage applying electrode is to be applied with a negative bias voltage, and the selective charge transporting layer is a layer selected from the group consisting of a layer containing at least a triphenylamine derivative and a layer containing at least a polyvinylcarbazole.

The first radiation detector in accordance with the present invention comprises: (i) the voltage applying electrode, to which a voltage is to be applied, (ii) the photo-conductor layer, which generates the electric charges when the radiation is irradiated to the photo-conductor layer, and (iii) the charge collecting electrode, which collects the electric charges corresponding to the quantity of the radiation, the voltage applying electrode, the photo-conductor layer, and the charge collecting electrode being overlaid one upon another, wherein the selective charge transporting layer is located between the voltage applying electrode and the photo-conductor layer, the selective charge transporting layer having the characteristics such that the selective charge transporting layer blocks the electric charges having the polarity identical with the polarity of the voltage applying electrode and transports the electric charges having the polarity opposite to the polarity of the voltage applying electrode, and wherein the selective charge transporting layer takes on the form of the thick film at the position corresponding to the edge region of the voltage applying electrode. Also, the second radiation detector in accordance with the present invention comprises the selective charge transporting layer located only at the position between the edge region of the voltage applying electrode and the photo-conductor layer, the selective charge transporting layer having the characteristics such that the selective charge transporting layer blocks the electric charges having the polarity identical with the polarity of the voltage applying electrode and transports the electric charges having the polarity opposite to the polarity of the voltage applying electrode. Therefore, with each of the first and second radiation detectors in accordance with the present invention, retention of the electric charges is suppressed at the position between the edge region of the voltage applying electrode and the photo-conductor layer, and breakdown is prevented at the edge region of the voltage applying electrode even in cases where the radiation detector is used repeatedly.

DESCRIPTION OF THE PREFERRED EMBODIMENTS

The present invention will hereinbelow be described in further detail with reference to the accompanying drawings.

Ordinarily, the radiation detectors may be classified into the direct conversion type, wherein the radiation is directly converted into electric charges, and wherein the thus formed electric charges are accumulated; and the indirect conversion type, wherein the radiation is converted into light by use of a scintillator, such as CsI:Tl or $Gd_2O_2S$:Tb, wherein the thus obtained light is then converted into electric charges by use of an a-Si photodiode, or the like, and wherein the thus formed electric charges are accumulated. The radiation detector in accordance with the present invention is capable of being employed for both the direct conversion type of the radiation detector and the indirect conversion type of the radiation detector. In the cases of the direct conversion type of the radiation detector, a thick photo-conductor layer is necessary for the efficient absorption of the radiation and the efficient generation of the electric charges, and the application of a high voltage is necessary for applying an electric field required for the thick photo-conductor layer. Therefore, in the cases of the direct conversion type of the radiation detector, the effects of the present invention are particularly high. Also, in the cases of the indirect conversion type of the radiation detector, the radiation detector in accordance with the present invention is capable of being employed for the type wherein a radiation detector having a similar constitution (a-Se layer (photo-conductor layer)) is set to be thin, wherein a light transmission type of a first electrode layer is located, and wherein fluorescence is received. In such cases, the photo-conductor layer is set at a film thickness of approximately 1 μm to approximately 30 μm, and the accumulating capacitors for the electric read-out technique need not necessarily be provided. The radiation detector in accordance with the present invention may be employed for the radiation, such as X-rays, γ-rays, and α-rays.

Also, the radiation detector in accordance with the present invention is capable of being employed for both the optical read-out technique, wherein a read-out operation is performed with a radiation image detector utilizing a semiconductor material capable of generating the electric charges when being exposed to light; and the electric read-out technique, wherein the electric charges having been generated with the irradiation of the radiation are accumulated, and wherein the accumulated electric charges are read out through an operation, in which an electric switch, such as the TFT, the CCD, or the CMOS sensor, is turned on and off with respect to each of pixels.

Figure 1:
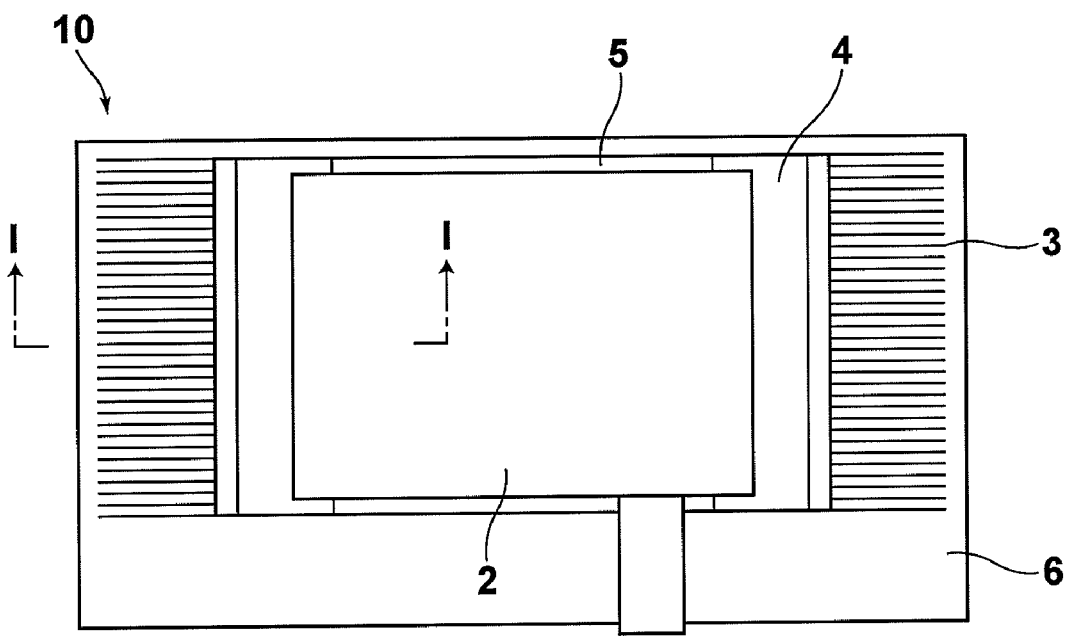
FIG. 1 is a schematic plan view showing an embodiment of the radiation detector in accordance with the present invention.
Figure 2:
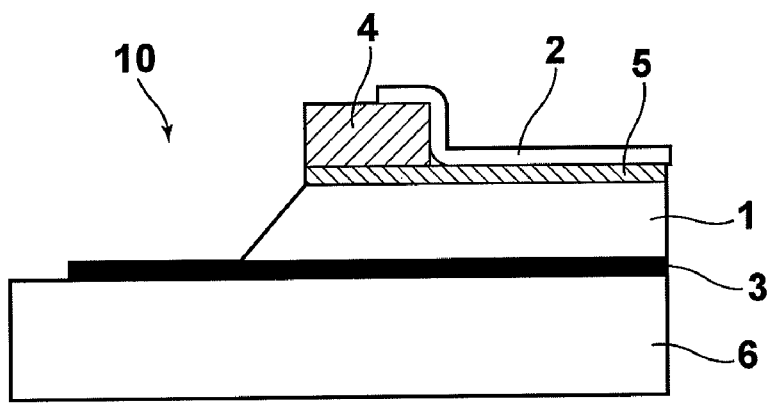
FIG. 2 is a sectional view taken on line I-I of FIG. 1.

An embodiment of the radiation detector in accordance with the present invention will be described hereinbelow with reference to FIG. 1 and FIG. 2. FIG. 1 is a schematic plan view showing an embodiment of the radiation detector in accordance with the present invention. FIG. 2 is a sectional view taken on line I-I of FIG. 1. With reference to FIG. 1 and FIG. 2, a radiation detector 10 comprises a charge collecting electrode (a bottom electrode) 3, a radiation-sensitive photo-conductor layer 1, a charge transporting layer 5, and a voltage applying electrode (a top electrode) 2, which are overlaid in this order on a substrate 6. The radiation detector 10 also comprises a selective charge transporting layer 4, which is located between the voltage applying electrode 2 and the charge transporting layer 5. The selective charge transporting layer 4 has the characteristics such that the selective charge transporting layer 4 blocks the electric charges having the polarity identical with the polarity of the voltage applying electrode 2 and transports the electric charges having the polarity opposite to the polarity of the voltage applying electrode 2. The selective charge transporting layer 4 takes on the form of a thick film at the position corresponding to an edge region of the voltage applying electrode 2. The charge transporting layer 5 and the selective charge transporting layer 4 may be made from an identical kind of a material. Alternatively, the charge transporting layer 5 and the selective charge transporting layer 4 may be made from different kinds of materials, which have the same type of selective transmissive functions.

The radiation detector 10 is utilized for performing a radiation detecting operation, wherein a predetermined bias voltage is applied between the voltage applying electrode 2 and the charge collecting electrode 3, the electric charges having been generated with the irradiation of the radiation are collected by the charge collecting electrode 3, which is formed at the rear surface of the photo-conductor layer 1, and wherein the thus collected electric charges are taken out as a radiation detection signal. In the radiation detecting operation, a particularly high electric field is formed at the edge region of the voltage applying electrode 2 (i.e., at the region corresponding to the selective charge transporting layer 4 illustrated in FIG. 1 and FIG. 2). With the radiation detector 10 in accordance with the present invention, the selective charge transporting layer 4 is formed as a thick film at the aforesaid edge region of the voltage applying electrode 2. Therefore, with the radiation detector 10 in accordance with the present invention, retention of the electric charges is suppressed at the position between the edge region of the voltage applying electrode 2 and the photo-conductor layer 1, and breakdown is prevented at the edge region of the voltage applying electrode 2 even in cases where the radiation detector 10 is used repeatedly.

Heretofore, such that image defects may be suppressed, a charge transporting layer has been located at the entire area of the bottom surface of the voltage applying electrode 2 (which area corresponds to the image detection region). (The charge transporting layer 5 illustrated in FIG. 1 corresponds to the aforesaid charge transporting layer, which has heretofore been located at the entire area of the bottom surface of the voltage applying electrode 2.) However, in cases where the charge transporting layer having the predetermined film thickness is located under the voltage applying electrode 2, though the image improving effects are capable of being obtained, the breakdown at the edge region of the voltage applying electrode 2 is not capable of being efficiently prevented from occurring.

Figure 3:
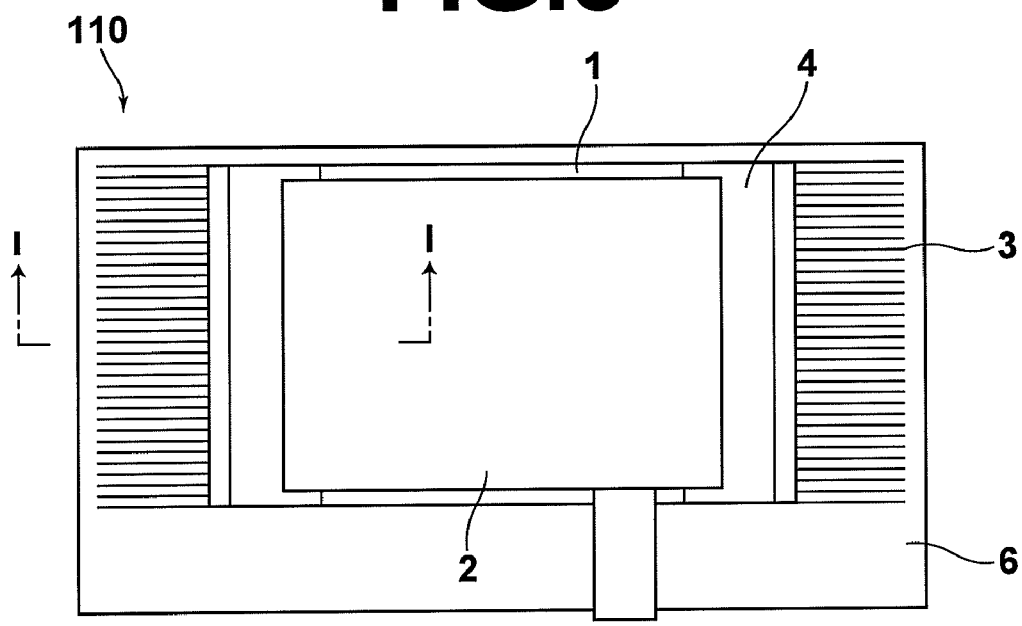
FIG. 3 is a schematic plan view showing a different embodiment of the radiation detector in accordance with the present invention.
Figure 4:
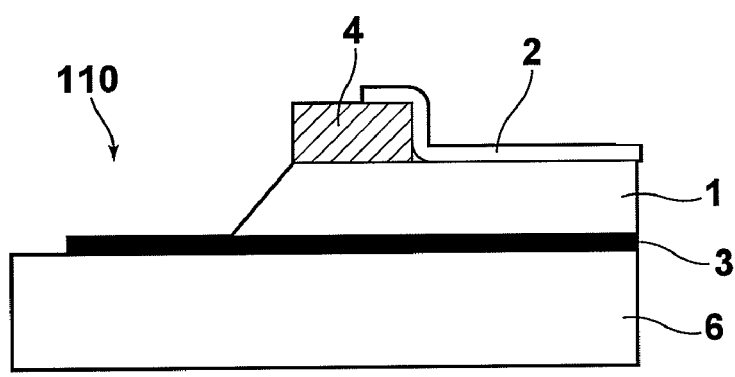
FIG. 4 is a sectional view taken on line I-I of FIG. 3.

FIG. 3 is a schematic plan view showing a different embodiment of the radiation detector in accordance with the present invention. FIG. 4 is a sectional view taken on line I-I of FIG. 3. In FIG. 3 and FIG. 4, similar elements are numbered with the same reference numerals with respect to FIG. 1 and FIG. 2. A radiation detector 110 illustrated in FIG. 3 and FIG. 4 is constituted basically in the same manner as that for the radiation detector 10 illustrated in FIG. 1 and FIG. 2, except that the charge transporting layer 5, which has the predetermined film thickness and has been located on the photo-conductor layer 1, is omitted, and except that the selective charge transporting layer 4 is located only at the position between the edge region of the voltage applying electrode 2 and the photo-conductor layer 1. The selective charge transporting layer 4 has the characteristics such that the selective charge transporting layer 4 blocks the electric charges having the polarity identical with the polarity of the voltage applying electrode 2 and transports the electric charges having the polarity opposite to the polarity of the voltage applying electrode 2.

Specifically, in the embodiment of the radiation detector 110 illustrated in FIG. 3 and FIG. 4, the charge transporting layer is not located on the entire area of the top surface of the photo-conductor layer 1, and the selective charge transporting layer 4 is located only at the position between the edge region of the voltage applying electrode 2 and the photo-conductor layer 1. With this embodiment of the radiation detector 110 in accordance with the present invention, the retention of the electric charges is suppressed at the position between the edge region of the voltage applying electrode 2 and the photo-conductor layer 1, and breakdown is prevented at the edge region of the voltage applying electrode 2 even in cases where the radiation detector 110 is used repeatedly. More specifically, the region at which it is necessary for the selective charge transporting layer 4 to be located is the region at which there is an electrode part having a low potential under the voltage applying electrode 2. Ordinarily, at the region described above, a high electric field occurs between the charge collecting electrode 3 and the edge of the voltage applying electrode 2. The thick selective charge transporting layer 4 employed in accordance with the present invention need not necessarily be located at a region, at which there is no take-out wiring on the substrate 6 and at which there is no risk that a high electric field will occur.

The selective charge transporting layer 4 may be constituted of a composition identical with the composition of the material, which is used for the charge transporting layer at the image detection region. Alternatively, the selective charge transporting layer 4 may be constituted of a composition different from the composition of the material, which is used for the charge transporting layer at the image detection region. However, it is necessary that the selective charge transporting layer 4 is constituted of a material which has the characteristics such that the material blocks the electric charges having the polarity identical with the polarity of the voltage applying electrode 2 and transports the electric charges having the polarity opposite to the polarity of the voltage applying electrode 2. Therefore, in cases where the voltage applying electrode 2 is to be applied with a negative bias voltage, the selective charge transporting layer 4 is constituted of a positive charge transportable material, i.e. a hole transportable material.

Examples of the preferable hole transportable materials include an inorganic material, such as antimony sulfide, as will be described later with reference to the charge transporting layer, and organic hole transportable materials, such as a triphenylamine derivative compound (an arylamine type compound), e.g. a compound A shown below, and a polyvinylcarbazole (a carbazole type compound), e.g. a compound B shown below.

Compound A:

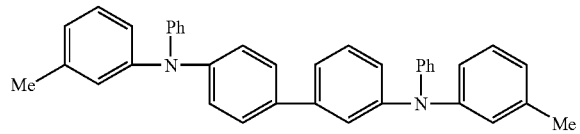

Compound B:

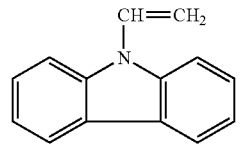

In cases where the organic hole transportable material A is used, it should preferably be used in the form contained in a binder. Examples of the preferable binder polymers include a polycarbonate, a polymethyl methacrylate, and a novolak resin.

The selective charge transporting layer 4 may be made from the aforesaid inorganic transportable material alone, or the aforesaid organic transportable material alone. The selective charge transporting layer 4 should preferably be constituted of a laminate structure comprising the layer of the inorganic transportable material and the layer of the organic transportable material. Such that the breakdown may be prevented from occurring without the charge recombination at the voltage applying electrode 2 being obstructed, the selective charge transporting layer 4 should preferably be constituted such that high hole transportability may be obtained and such that no defect may be contained. Therefore, more appropriate effects are capable of being obtained in cases where the selective charge transporting layer 4 is constituted of the laminate structure comprising the layer of the inorganic transportable material, which has high transportability, and the layer of the organic transportable material, which is not apt to suffer from detects. In cases where the selective charge transporting layer 4 is constituted of the laminate structure comprising the layer of the inorganic transportable material and the layer of the organic transportable material, the layer of the inorganic transportable material may be laminated as an upper layer, or the layer of the organic transportable material may be laminated as the upper layer.

The layer thickness of the selective charge transporting layer 4 located at the edge region of the voltage applying electrode 2 (i.e., the layer thickness of the thick film region of the selective charge transporting layer 4) may vary in accordance with the material used. Ordinarily, in the constitution illustrated in FIG. 1 and FIG. 2, the layer thickness of the selective charge transporting layer 4 located at the edge region of the voltage applying electrode 2 should preferably be 0.5 to 100 times as large as the layer thickness of the charge transporting layer 5, which is located at the image detection region, should more preferably be 1.0 to 10 times as large as the layer thickness of the charge transporting layer 5, which is located at the image detection region, and should most preferably be 1.2 to 5 times as large as the layer thickness of the charge transporting layer 5, which is located at the image detection region. Also, in the constitution illustrated in FIG. 3 and FIG. 4, wherein the charge transporting layer is not located on the entire area of the top surface of the photo-conductor layer 1, and wherein the selective charge transporting layer 4 located between the edge region of the voltage applying electrode 2 and the photo-conductor layer 1, the layer thickness of the selective charge transporting layer 4 should preferably fall within the range of 0.1 µm to 10 µm, should more preferably fall within the range of 0.2 µm to 5 µm, and should most preferably fall within the range of 0.4 µm to 1 µm.

The edge of the voltage applying electrode 2 should preferably take a position on the position of one-half of the width of the selective charge transporting layer 4. In such cases, the edge of the voltage applying electrode 2 is capable of being set in the state most isolated in electric field from the charge collecting electrode 3.

From the view point of easiness of formation and maximization of the image acquisition region, the outside edge of the selective charge transporting layer 4 should preferably take the position coinciding with the position of the shoulder of the photo-conductor layer 1 (i.e., the position of the outside edge of the region of the photo-conductor layer 1, which region may be regarded as having the constant film thickness). Alternatively, in cases where the selective charge transporting layer 4 is made from a material having the quality such that the layer is capable of being formed easily at the gradient part of the photo-conductor layer 1, the outside edge of the selective charge transporting layer 4 may take the position more outward than the position of the shoulder of the photo-conductor layer 1.

In order for the discharge preventing effects to be obtained, the inside edge of the selective charge transporting layer 4 should preferably take a position deep from the shoulder of the photo-conductor layer 1 toward the inside of the photo-conductor layer 1. However, if the inside edge of the selective charge transporting layer 4 takes a position markedly deep from the shoulder of the photo-conductor layer 1 toward the inside of the photo-conductor layer 1, the area of the image formation region will become markedly small. Therefore, the inside edge of the selective charge transporting layer 4 should preferably take a position falling within the range of 0.5 mm to 4 mm, as measured from the shoulder of the photo-conductor layer 1 toward the inside of the photo-conductor layer 1, and should more preferably take a position falling within the range of 1 mm to 2 mm, as measured from the shoulder of the photo-conductor layer 1 toward the inside of the photo-conductor layer 1.

The charge transporting layer 5, which is located over the entire area of the top surface of the photo-conductor layer 1, is the layer, which has the electrical insulating characteristics with respect to the electric charges having the polarity identical with the polarity of the voltage applying electrode 2, and which has the electrical conductivity with respect to the electric charges having the polarity opposite to the polarity of the voltage applying electrode 2. The charge transporting layer 5 may be made from a material identical with the material of the selective charge transporting layer 4, which is located at the position corresponding to the edge region of the voltage applying electrode 2. Alternatively, the charge transporting layer 5 may be made from a material different from the material of the selective charge transporting layer 4, which is located at the position corresponding to the edge region of the voltage applying electrode 2. The functions which the charge transporting layer 5 should have are the prevention of the breakdown and the prevention of non-uniform charge injection from the voltage applying electrode 2, which non-uniform charge injection causes image defects to occur. Therefore, the material for the charge transporting layer 5 is selected from the materials capable of satisfying the functions described above. For example, the charge transporting layer 5 may be constituted of a polymer, such as an acrylic type organic resin, a polyimide, BCB, PVA, an acrylic polymer, a polyethylene, a polycarbonate, or a polyether imide; a sulfide, such as $As_2S_3$, $Sb_2S_3$, or ZnS; an oxide; or a fluoride. The charge transporting layer 5 should preferably be a film, which has the electrical insulating characteristics with respect to the electric charges having the polarity to be accumulated and which has the electrical conductivity with respect to the electric charges having the polarity reverse to the polarity of the electric charges to be accumulated. The charge transporting layer 5 should more preferably be constituted of a substance having the characteristics such that the product of mobility× life varies by at least 3 orders of ten for the electric charges of different polarities. Examples of the substances described above include a sulfide, such as $As_2S_3$, $Sb_2S_3$, or ZnS; an oxide; and a fluoride.

Specifically, the charge transporting layer 5 should more preferably be constituted of a substance, such as $As_2Se_3$; $As_2Se_3$ having been doped with Cl, Br, and/or I in a doping concentration falling within the range of 500 ppm to 20,000 ppm; $As_2(Se_xTe_{1-x})_3$ (where 0.5<x<1), which is obtained from the processing wherein at most approximately 50% of Se in $As_2Se_3$ is substituted by Te; a substance, which is obtained from the processing wherein at most approximately 50% of Se in $As_2Se_3$ is substituted by S; a substance, which is obtained from the processing wherein the As concentration is altered by approximately ±15% from $As_2Se_3$; or an amorphous Se—Te type substance, in which the Te concentration falls within the range of 5 wt % to 30 wt %. In cases where the substance containing the chalcogenide type element as described above is employed, the thickness of the charge transporting layer 5 should preferably fall within the range of 0.4 μm to 3.0 μm, and should more preferably fall within the range of 0.5 μm to 2 μm. The charge accumulating layer 3 may be formed with one time of film forming operation. Alternatively, the charge transporting layer 5 may be constituted of laminated layers having been formed with a plurality of times of film forming operations.

The charge transporting layer 5 constituted of the organic film should preferably be made from a compound, which is obtained from the processing for doping a charge transportation agent into the polymer, such as the acrylic type organic resin, the polyimide, BCB, PVA, the acrylic polymer, the polyethylene, the polycarbonate, or the polyether imide. Examples of preferable charge transportation agents include the molecules selected from the group consisting of tris(8-quinolinolato) aluminum ($Alq_3$), N,N-diphenyl-N,N-di(m-tolyl)benzidine (TPD), a poly-para-phenylene vinylene (PPV), a polyalkyl thiophene, a polyvinyl carbazole (PVK), triphenylene (TNF), a metallo-phthalocyanine, 4-(dicyanomethylene)-2-methyl-6-(p-dimethylaminostyryl)-4H-pyran (DCM), a liquid crystal molecule, hexapentyloxytriphenylene, a discotic liquid crystal molecule in which a center part core contains a n-conjugated condensed ring or a transition metal, carbon nanotube, and fullerene. The doping concentration of the charge transportation agent is set at a value falling within the range of 0.1 wt % to 50 wt %.

The photo-conductor layer 1 may be constituted of a photo-conductor substance which is capable of absorbing the electromagnetic wave and is capable of generating the electric charges. The photo-conductor layer 1 may be constituted of a compound containing, as a principal constituent, at least one kind of compound selected from the group consisting of an amorphous selenium compound, $Bi_{12}MO_{20}$ (M: Ti, Si, Ge), $Bi_4M_3O_{12}$ (M: Ti, Si, Ge), $Bi_2O_3$, $BiMO_4$ (M: Nb, Ta, V), $Bi_2WO_6$, $Bi_{24}B_2O_{39}$, ZnO, ZnS, ZnSe, ZnTe, $MNbO_3$ (M: Li, Na, K), PbO, $HgI_2$, $PbI_2$, CdS, CdSe, CdTe, $BiI_3$, and GaAs. The photo-conductor layer 1 should preferably be constituted of the amorphous selenium compound.

In the cases of the amorphous selenium compound, it is possible to employ an amorphous selenium compound layer having been doped with an alkali metal, such as Li, Na, K, Cs, or Rb, in a trace quantity falling within the range of 0.001 ppm to 1 ppm; an amorphous selenium compound layer having been doped with a fluoride, such as LiF, NaF, KF, CsF, or RbF, in a trace quantity falling within the range of 10 ppm to 10,000 ppm; an amorphous selenium compound layer having been doped with P, As, Sb, or Ge in a doping concentration falling within the range of 50 ppm to 0.5%; an amorphous selenium compound layer having been doped with As in a doping concentration falling within the range of 10 ppm to 0.5%; or an amorphous selenium compound layer having been doped with Cl, Br, or I in a trace quantity falling within the range of 1 ppm to 100 ppm.

Particularly, it is preferable to employ amorphous selenium having been doped with As in a doping concentration falling within the range of approximately 10 ppm to approximately 200 ppm; amorphous selenium having been doped with As in a doping concentration falling within the range of approximately 0.2% to approximately 1% and have further been doped with Cl in a doping concentration falling within the range of 5 ppm to 100 ppm; or amorphous selenium having been doped with an alkali metal in a doping concentration falling within the range of approximately 0.001 ppm to approximately 1 ppm.

It is also possible to employ a compound containing fine particles of a photo-conductor substance having a size of several nanometers to several microns, such as $Bi_{12}MO_{20}$ (M: Ti, Si, Ge), $Bi_4M_3O_{12}$ (M: Ti, Si, Ge), $Bi_2O_3$, $BiMO_4$ (M: Nb, Ta, V), $Bi_2WO_6$, $Bi_{24}B_2O_{39}$, ZnO, ZnS, ZnSe, ZnTe, $MNbO_3$ (M: Li, Na, K), PbO, $HgI_2$, $PbI_2$, CdS, CdSe, CdTe, $BiI_3$, and GaAs.

In cases where amorphous selenium is employed, the thickness of the photo-conductor layer 1 should preferably fall within the range of 100 μm to 2,000 μm. Particularly, in cases where the radiation detector is to be used for mammography, the thickness of the photo-conductor layer 1 should more preferably fall within the range of 150 μm to 250 μm. Also, in cases where the radiation detector is to be used for general image recording operations, the thickness of the photo-conductor layer 1 should more preferably fall within the range of 500 μm to 1,200 μm.

The voltage applying electrode 2, which is formed on the top surface of the photo-conductor layer 1, should preferably be constituted of a thin metal film. The voltage applying electrode 2 is capable of being formed from a metal material, such as Au, Ni, Cr, Au, Pt, Ti, Al, Cu, Pd, Ag, Mg, an MgAg3-20% alloy, an Mg—Ag type inter-metal compound, an MgCu3-20% alloy, or an Mg—Cu type inter-metal compound.

The voltage applying electrode 2 should preferably be formed from Au or the Mg—Ag type inter-metal compound. For example, in cases where the voltage applying electrode 2 is formed from Au, the thickness of the voltage applying electrode 2 should preferably fall within the range of 15 nm to 200 nm, and should more preferably fall within the range of 30 nm to 100 nm. Also, in cases where the voltage applying electrode 2 is formed from the MgAg3-20% alloy, the thickness of the voltage applying electrode 2 should preferably fall within the range of 100 nm to 400 nm.

The voltage applying electrode 2 may be formed by one of various techniques and should preferably be formed by the vacuum evaporation processing utilizing a resistance heating technique.

For example, after a metal mass has been fused within a boat by the resistance heating technique, the shutter may be opened, the vacuum evaporation processing may be performed for 15 seconds, and a cooling step may be conducted. The operations may be iterated a plurality of times until the resistance value becomes sufficiently. In this manner, the voltage applying electrode 2 is capable of being formed.

In the cases of the optical read-out technique, the charge collecting electrode 3 has a comb type electrode structure, in which a plurality of electrodes are located alternately in a stripe-like pattern for taking out a signal. It is necessary for the charge collecting electrode 3 to be transparent, such that light is capable of being irradiated from the rear surface. Also, it is necessary for the charge collecting electrode 3 to have flatness, such that the problems are capable of being prevented from occurring with regard to, for example, breakage due to electric field concentration at the time of the application of a high voltage. For example, as the charge collecting electrode 3, IZO or ITO is utilized. By way of example, in the cases of IZO, the thickness of the charge collecting electrode 3 should preferably be equal to 0.2 μm, and the flatness of the charge collecting electrode 3 should preferably be such that Ra=1 nm. In the cases of the TFT read-out technique, the charge collecting electrode 3 is constituted of an active matrix substrate. The active matrix substrate comprises a plurality of pixels, each of which is provided with a collecting electrode for collecting the electric charges having been generated in the photo-conductor layer, an accumulating capacitor for accumulating the electric charges having been collected by the collecting electrode, and a TFT switch for reading out the electric charges having been accumulated by the accumulating capacitor. The active matrix substrate also comprises a plurality of scanning wires for turning on and off the TFT switches. The active matrix substrate further comprises a plurality of data wires for reading out the electric charges having been accumulated by the accumulating capacitors.

In the cases of the radiation detector for the optical read-out technique, besides the layers described above, when necessary, the radiation detector may be provided with layers, such as a reading photo-conductor layer, a charge accumulating layer, a surface protective layer, an undercoat layer, an overcoat layer, and a crystallization preventing layer. The photo-conductor layer 1 described above is capable of being utilized as the recording photo-conductor layer. In the cases of the radiation detector for the TFT read-out technique, besides the layers described above, when necessary, the radiation detector may be provided with layers, such as a surface protective layer, an undercoat layer, an overcoat layer, and a crystallization preventing layer. The layers described above are capable of being formed with known materials and known forming processes.

The present invention will further be illustrated by the following non-limitative examples.

EXAMPLES

Example 1

An active matrix substrate was prepared. The active matrix substrate comprised a plurality of pixel structures, each of which was provided with a collecting electrode, an accumulating capacitor, and a TFT switch. The active matrix substrate also comprised a plurality of scanning wires for turning on and off the TFT switches. The active matrix substrate further comprised a plurality of data wires for reading out the electric charges. A photo-conductor layer constituted of Se was then formed by vacuum evaporation processing to a thickness of 200 μm on the active matrix substrate. Thereafter, an antimony sulfide ($Sb_2S_3$) layer for preventing image defects from occurring was formed by the vacuum evaporation processing to a thickness of 0.3 μm.

A solution, which contained 4 g of the hole transportable material A described above and 4 g of a polycarbonate resin in 100 g of chlorobenzene, was coated onto an edge region of the $Sb_2S_3$-covered Se layer by use of an ink jet apparatus. A thick film region having a thickness of 0.5 μm and a width of 2 mm was thus formed at the edge region of the $Sb_2S_3$-covered Se layer. Thereafter, a gold layer was formed by the vacuum evaporation processing such that an edge of the gold layer might take a position at the middle part of the aforesaid thick film region, and a voltage applying electrode constituted of the gold layer was thus formed. In this manner, a radiation detector for the electric read-out technique was produced.

Comparative Example 1

A radiation detector was produced in the same manner as that in Example 1, except that a thick film region having the thickness and the width identical with those in Example 1 was formed by use of a solution, which did not contain the hole transportable material A and contained only the polycarbonate resin, and except that an electrical insulating layer constituted of a silicon resin was formed to a thickness of 100 μm on the thick film region.

Comparative Example 2

A radiation detector was produced in the same manner as that in Comparative Example 1, except that the thick film region and the electrical insulating layer were not formed.

Example 2

A reading photo-conductor layer constituted of Se was formed by the vacuum evaporation processing to a thickness of 15 μm on a glass substrate having been provided with read-out electrode lines. Thereafter, an electron accumulating layer constituted of $As_2Se_3$ and having a thickness of 1.0 μm was formed by the vacuum evaporation processing on the reading photo-conductor layer, and a recording photo-conductor layer constituted of Se and having a thickness of 200 μm was subsequently formed by the vacuum evaporation processing on the electron accumulating layer. Thereafter, a polyvinylcarbazole having been dissolved in trichloroethylene was coated onto a position (an edge region of the Se layer), which position corresponded to an edge of a gold electrode, by use of an ink jet apparatus. A thick film region having a thickness of 0.4 μm and a width of 3 mm was thus formed in a slit-like shape at the edge region of the Se layer. Thereafter, a gold layer was formed by the vacuum evaporation processing such that an edge of the gold layer might take a position at the middle part of the aforesaid thick film region, and a voltage applying electrode constituted of the gold layer was thus formed. In this manner, a radiation detector for the optical read-out technique was produced. The constitution other than the constitution described above for the optical read-out technique was prepared in accordance with the description in U.S. Pat. No. 6,268,614.

Comparative Example 3

A radiation detector was produced in the same manner as that in Example 2, except that the thick film region constituted of the polyvinylcarbazole was not formed, and except that a polycarbonate acting as an electrical insulator was formed to a thickness of 1 μm.

Comparative Example 4

A radiation detector was produced in the same manner as that in Comparative Example 3, except that the electrical insulating layer was not formed.

(Evaluation Method)

Each of the radiation detectors having been produced in Examples 1 and 2 and Comparative Examples 1, 2, 3, and 4 was set on a durability testing apparatus. As for each of the radiation detectors having been produced in Example 1 and Comparative Examples 1 and 2, the application of a rectangular wave of a 6 kV negative bias voltage to the bias electrode was iterated. Also, as for each of the radiation detectors having been produced in Example 2 and Comparative Examples 3 and 4, the application of a rectangular wave of a 2 kV negative bias voltage to the bias electrode was iterated. The voltage application was iterated until breakdown occurred. The results shown in Table 1 below were obtained.

TABLE 1

| | Voltage applying cycle before breakdown occurs |
|---|---|
| Example 1 | No breakdown before 300,000 times of voltage applications |
| Example 2 | No breakdown before 350,000 times of voltage applications |
| Comp. Example 1 | Breakdown by 50,000 times of voltage applications |
| Comp. Example 2 | Breakdown by 80,000 times of voltage applications |
| Comp. Example 3 | Breakdown by 80,000 times of voltage applications |
| Comp. Example 4 | Breakdown by 120,000 times of voltage applications |

As clear from Table 1, as for the radiation detector having been produced in Example 1, wherein the selective charge transporting layer was located between the voltage applying electrode and the photo-conductor layer, and wherein the selective charge transporting layer took on the form of the thick film at the position corresponding to the edge region of the voltage applying electrode, and as for the radiation detector having been produced in Example 2, wherein the selective charge transporting layer was located only at the position between the edge region of the voltage applying electrode and the photo-conductor layer, the breakdown did not occur in cases where the voltage application was iterated at least 300,000 times. As for each of the radiation detectors having been produced in Comparative Examples 1 and 3, wherein the electrical insulator was located, the breakdown was more apt to occur than each of the radiation detectors having been produced in Comparative Examples 2 and 4, wherein the electrical insulator was not located. Particularly, as for the radiation detector having been produced in Comparative Example 2, wherein the charge transporting layer was located over the entire area of the surface, the effects were not capable of being obtained on prevention of breakdown.

As described above, with the radiation detector in accordance with the present invention, retention of the electric charges was suppressed at the position between the edge region of the voltage applying electrode and the photo-conductor layer, and breakdown was prevented at the edge region of the voltage applying electrode even in cases where the radiation detector was used repeatedly.

What is claimed is:

1. A radiation detector, comprising:
   i) a voltage applying electrode, to which a voltage is to be applied,
   ii) a photo-conductor layer, which generates electric charges when radiation is irradiated to the photo-conductor layer, and
   iii) a charge collecting electrode, which collects the electric charges corresponding to a quantity of the radiation,
   the voltage applying electrode, the photo-conductor layer, and the charge collecting electrode being overlaid one upon another, and a charge transporting layer on the photoconductor layer;
   wherein a selective charge transporting layer is located between an edge region of the voltage applying electrode and the photo-conductor layer, the selective charge transporting layer having characteristics such that the selective charge transporting layer blocks electric charges having a polarity identical with the polarity of the voltage applying electrode and transports electric charges having a polarity opposite to the polarity of the voltage applying electrode, and the selective charge transporting layer is in direct contact with the voltage applying electrode at a position corresponding to the edge region of the voltage applying electrode; wherein the charge transporting layer is insulative with respect to electric charges having the same polarity as the polarity of the voltage applying electrode, and conductive with respect to electric charges having a polarity opposite the polarity of the voltage applying electrode; and the charge transport layer is provided across the entire undersurface of the voltage applying electrode.

2. A radiation detector as defined in claim 1 wherein the selective charge transporting layer is constituted of a laminate structure comprising an inorganic selective transportable material layer and an organic selective transportable material layer.

3. A radiation detector as defined in claim 2 wherein the voltage applying electrode is to be applied with a negative bias voltage, and
   the selective charge transporting layer is a layer selected from the group consisting of a layer containing at least a triphenylamine derivative and a layer containing at least a polyvinylcarbazole.

4. A radiation detector as defined in claim 1 wherein the voltage applying electrode is to be applied with a negative bias voltage, and
   the selective charge transporting layer is a layer selected from the group consisting of a layer containing at least a triphenylamine derivative and a layer containing at least a polyvinylcarbazole.

5. A radiation detector as defined in claim 1, wherein:
   the thickness of the selective charge transporting layer is within a range from 0.1 μm to 10 μm.

6. A radiation detector as defined in claim 1,
   wherein the thickness of the selective charge transporting layer is within a range from 0.5 times to 100 times the thickness of the charge transporting layer.

7. A radiation detector as defined in claim 1,
   wherein the selective charge transporting layer is in direct contact with the charge transport layer at a position corresponding to an edge region of the voltage applying electrode.

8. A radiation detector as defined in claim 7, wherein:
   a portion of the voltage applying electrode is in direct contact with the charge transport layer.

9. A radiation detector as defined in claim 1,
   wherein the charge transporting layer is formed by a material different from that of the selective charge transport layer.

10. A radiation detector as defined in claim 1,
    wherein the charge transporting layer is formed by the same material as that of the selective charge transport layer.

11. A radiation detector as defined in claim 1, wherein:
    the selective charge transporting layer is in direct contact with the photo conductor layer at a position corresponding to the edge region of the voltage applying electrode.

12. A radiation detector as defined in claim 11, wherein:
    a portion of the voltage applying layer is in direct contact with the photo conductor layer.

13. A radiation detector, comprising:
    i) a voltage applying electrode, to which a voltage is to be applied,
    ii) a photo-conductor layer, which generates electric charges when radiation is irradiated to the photo-conductor layer, and iii) a charge collecting electrode, which collects the electric charges corresponding to a quantity of the radiation, the voltage applying electrode, the photo-conductor layer, and the charge collecting electrode being overlaid one upon another, wherein a selective charge transporting layer is located only at a position between an edge region of the voltage applying electrode and the photo-conductor layer, the selective charge transporting layer having characteristics such that the selective charge transporting layer blocks electric charges having a polarity identical with the polarity of the voltage applying electrode and transports electric charges having a polarity opposite to the polarity of the voltage applying electrode, wherein the selective charge transporting layer is constituted of a laminate structure comprising an inorganic selective transportable material layer and an organic selective transportable material layer.

14. A radiation detector as defined in claim 13 wherein the voltage applying electrode is to be applied with a negative bias voltage, and the selective charge transporting layer is a layer selected from the group consisting of a layer containing at least a triphenylamine derivative and a layer containing at least a polyvinylcarbazole.

* * * * *